United States Patent
Bryan-Brown et al.

(10) Patent No.: US 6,727,046 B1
(45) Date of Patent: Apr. 27, 2004

(54) PROCESS FOR MAKING A PERIODIC PROFILE

(75) Inventors: Guy Peter Bryan-Brown, Malvern (GB); Emma Louise Wood, Malvern (GB)

(73) Assignee: ZBD Displays Limited, Malvern (GB)

( * ) Notice: Subject to any disclaimer, the term of this patent is extended or adjusted under 35 U.S.C. 154(b) by 0 days.

(21) Appl. No.: 10/333,977

(22) PCT Filed: Jul. 25, 2001

(86) PCT No.: PCT/GB01/03305

§ 371 (c)(1),
(2), (4) Date: Jan. 28, 2003

(87) PCT Pub. No.: WO02/10857

PCT Pub. Date: Feb. 7, 2002

(30) Foreign Application Priority Data

Jul. 29, 2000 (GB) .............................................. 0018629

(51) Int. Cl.⁷ ............................. G03F 7/00; G03F 7/095
(52) U.S. Cl. ...................... 430/321; 430/320; 430/325; 430/326; 349/124
(58) Field of Search ................................ 430/320, 321, 430/325, 326; 428/1.2; 349/124

(56) References Cited

U.S. PATENT DOCUMENTS 4,131,506 A * 12/1978 Namba et al. .............. 156/643

| 4,211,834 A | 7/1980 | Lapadula et al. |
| 4,660,934 A | 4/1987 | Akiba et al. |

FOREIGN PATENT DOCUMENTS

| JP | 60-230650 A | * 11/1985 |
| WO | WO 9714990 | 4/1997 |

OTHER PUBLICATIONS

Patent Abstracts of Japan; vol. 016; No. 074 Feb. 24, 19992 & JP 03 265117A Nov. 26, 1991.

* cited by examiner

*Primary Examiner*—John A. McPherson
(74) *Attorney, Agent, or Firm*—Nixon & Vanderhye P.C.

(57) ABSTRACT

A first layer of photoresist material, sensitive to radiation of a first wavelength, has a second layer of photoresist material, sensitive to radiation of a second wavelength, deposited thereon. A pattern of radiation of the second wavelength is then formed on the second layer of photoresist material which is subsequently treated with a solvent, in which the first layer of photoresist material is insoluble, to develop a first periodic profile. The first layer of photoresist material is then exposed to radiation of the first wavelength through the first periodic profile and treated to develop a second periodic profile. By directing the radiation of the second wavelength through the first periodic profile at an angle to normal to the first material photoresist material a blaze profile may be obtained.

5 Claims, 2 Drawing Sheets

PROCESS FOR MAKING A PERIODIC PROFILE

This application is the US national phase of International Application No. PCT/GB01/03305, filed Jul. 25, 2001, which designated the U.S., the entire content of which is hereby incorporated by reference.

This invention relates to a process for making periodic profiles, in particular a to a method of fabricating grating structures, especially blazed grating structures in photoresist material.

Grating structures, which are structures having a periodic profile in one particular cross section, can be fabricated using a variety of techniques. A convenient and well known method of producing a grating structure is to expose a layer of photo-resist material to a pattern of light of a periodically varying intensity. For a positive photoresist material, any area which is exposed to light can be removed by a development process whilst for a negative photoresist material any area which is not exposed to light can be removed by a development process. Photoresist materials are generally only photosensitive to radiation in a certain range.

One method of producing light of a periodically varying intensity is to form an interference pattern. The exposure of a photoresist layer to such an interference pattern, which can be produced by any number of interferometric techniques that are well known to a person skilled in the art, allows a range of symmetric grating profiles to be produced. However, by the nature of this technique, it is difficult to obtain a high degree of grating asymmetry uniformly over a large area. Obtaining short pitch gratings with large groove depths is also difficult using this technique. To obtain grating profiles other than sinusoidal requires over-exposure of the layer, and the level of background radiation associated with the interference pattern may then expose the whole photoresist layer.

A greater range of grating profiles may be obtained using hard contact photolithography, in which a chrome mask is placed in intimate contact (within 0.2 $\mu$m) with the photoresist coated substrate. This approach allows asymmetric grating profiles to be attained but, because of the requirement for the mask to be in intimate contact with the substrate, it is difficult to realise asymmetric gratings over a large area. Additionally, the minimum pitch of grating which can be produced using this technique is limited by the resolution of chrome mask fabrication. The highest resolution chrome mask which can be readily fabricated is of approximately 0.8 $\mu$m pitch, and such masks are generally fragile, therefore having a short useful lifetime, and may produce unwanted diffraction effects.

It is also possible to fabricate grating structures using ruling techniques, but these tend to be prohibitively expensive.

It is an object of the present invention to provide an inexpensive method of making gratings that mitigates some of the disadvantages, as described above, that are associated with conventional methods of grating fabrication.

According to this invention, a process for making a periodic profile in a photoresist layer comprises the steps of taking a first layer of photoresist material which will react to radiation of a first wavelength and which has deposited on it a second layer of photoresist material which will react to radiation of a second wavelength and wherein the first photoresist material is substantially insoluble in the second solvent and wherein the layer of second photoresist material is substantially opaque to the radiation of the first wavelength, exposing the layer of second photoresist material to a pattern of radiation of the second wavelength, treating the layer of second photoresist material with the second solvent so as to develop a first periodic profile, exposing the layer of first photoresist material to radiation of the first wavelength through the first periodic profile and treating the layer of first photoresist material with the first solvent so as to develop a second periodic profile.

The use of dual layers of photoresist material in the process offers various advantages, including the ability to fabricate short pitch gratings which, because of the proximity of the mask formed in the second photoresist material, can be formed deep into the first photoresist material with a very high resolution. This mitigates some of the disadvantages associated with the chrome mask method described above.

Additional advantages of the dual layer photoresist process also include the masked areas of the layer of first photoresist material having minimal exposure to radiation of the first wavelength when the layer of first photoresist material is exposed to radiation of the first wavelength through the first periodic profile. This mitigates some of the disadvantage associated with the known technique of exposing a single layer of photoresist to an interference pattern.

A preferred embodiment of this invention provides a process for making a periodic profile in a photoresist layer wherein exposing the layer of first photoresist material to radiation of the first wavelength through the first periodic profile is performed with the radiation being directed toward the first layer at an angle away from the normal to the first photo-resist material. This allows blazed grating structures to be fabricated. A particular advantage of this embodiment is that it allows deep, short pitch blazed gratings to be made.

Additionally, the process for making a periodic profile in a photoresist layer described above may further comprise the initial step of depositing a layer of second photoresist on the layer of first photoresist and possibly depositing a layer of first photoresist on a substrate.

In a preferred embodiment, the process for making a periodic profile in a photoresist layer, as described above, makes use of PMGI as the first photoresist material and Shipley's S1805 resist as the second photoresist material.

A person skilled in the art would immediately recognize that the gratings made using the process described above could be used, amongst other things, as diffraction gratings or to impart alignment to liquid crystal molecules as part of a liquid crystal device (for example the Zenithal Bistable Device of WO 97/14990 or the Azimuthal Bistable device of GB Application 0001955.4).

This invention will now be described, by way of example only, with reference to FIGS. 1 to 3, wherein.

An general embodiment of the present invention will now be described with reference to FIG. 1.

Figure 1C:
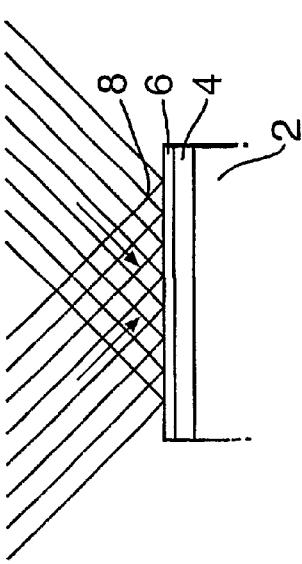
FIG. 1 illustrates the principle behind the dual photoresist technique for blazed grating fabrication.
Figure 1F:
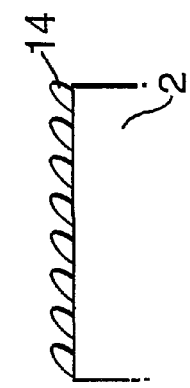
Figure 1B:
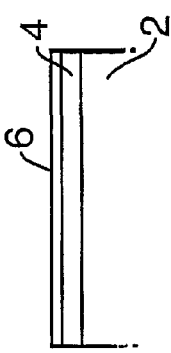
Figure 1E:
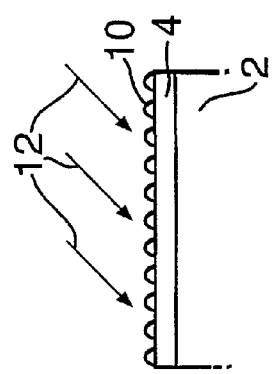
Figure 1A:
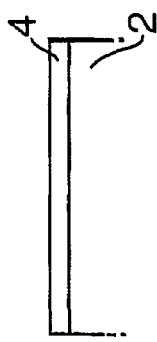

Referring to FIG. 1(a) and 1(b), a substantially flat substrate (2) is spin-coated with a layer of PMGI photoresist material (4). A layer of Shipley's S1805 photo-resist (6) is then spin coated on top of the layer of PMGI material (4).

An interference pattern (8) is formed in the vicinity of the layer of Shipley's S1805 photo-resist material (6), using laser light of 457.8 nm wavelength. The Shipley's S1805 is sensitive to the 457.8 nm radiation, but the PMGI is insensitive to light of such a wavelength. After the Shipley's S1805 layer has been exposed for an appropriate time the grating is developed using the recommended Shipley process. The layer of PMGI is insoluble in the solvent that is used to develop the Shipley's S1805 layer.

Figure 1D:
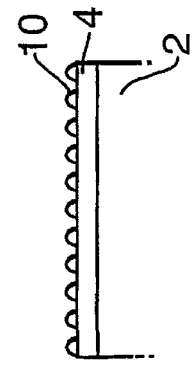

Referring to FIG. 1(d), after developing the Shipley's S1805 material a grating structure (10) is formed in what was the substantially flat layer of Shipley's S1805 material (6).

The PMGI is sensitive to radiation of 254 nm in wavelength, whilst the Shipley's S1805 layer is opaque at this wavelength and will act as a mask. Referring to FIG. 1(d), exposing the PMGI layer (4) to a collimated light source of 254 nm (12) through the mask formed by the Shipley's S1805 layer (10) results in a periodic variation of the intensity of light to which the PMGI layer (4) is exposed. The PMGI can then be developed, whereupon a grating structure (14) is formed in the previously substantially flat PMGI layer.

The angle at which the substantially collimated light is incident on the PMGI layer, (4), through the mask formed by the Shipley's S1805 layer (10), can be varied away from normal incidence thereby producing a blazed grating. The resolution of the mask formed by the Shipley's S1805 layer (10) is limited only by the resolution of the interference pattern, therefore short pitch grating structures (down to around 200 nm) are readily attainable. The close proximity of the mask formed by the Shipley's S1805 layer (10) and the underlying PMGI layer (4) will also allow relatively deep grating grooves, for a given pitch, to be attained.

Any two photo-resist materials may be used in the method described above, provided that:

i) the first layer (i.e. the layer in contact with the substrate) is insoluble in the solvents used to process the second (i.e. upper most) layer;

ii) the first layer is insensitive to light used to expose the second layer; and iii) that the second layer is opaque to light of the wavelength used to expose the first layer.

The layer of second photoresist material is ideally a positive material, although a negative material would be effective to a lesser extent, whilst the layer of first photoresist material may be either a positive or negative material.

EXAMPLE 1

The technique described with reference to FIG. 1 above has been used to fabricate a grating structure possessing deep grooves. The precise fabrication process used will now be described with reference to FIG. 2.

A glass substrate was cleaned and neat PMGI (poly (dimethyl-glutarinide) supplied by the Microlithography corporation) was deposited on it. The substrate was spun at 3000 rpm for 30 seconds. The solvent was removed by placing on a hotplate at 90° C. for 3 minutes. The substrate was then oven baked on a hotplate at 250° C. for 15 minutes which results in 1.1 µm thick film.

When cool, a layer of Shipley photoresist S1805 was spun (at 3000 rpm) onto the substrate which resulted in a 550 nm film of photoresist. The substrate was pre-baked on hotplate at 100° C. for 10 minutes.

The substrate was exposed in interferometer, for 900 seconds, to radiation of wavelength $\lambda$=457.9 nm using a 300 mW expanded laser beam.

The substrate was developed in Shipley MF319 developer for 45 seconds to obtain a truncated profile in photoresist.

The substrate was then exposed at normal incidence, and for 400 seconds, to light of $\lambda$=254 nm. The substrate was developed in MF319 for 10 seconds to obtain symmetric grating profile shown in FIG. 2.

EXAMPLE 2

Figure 3:
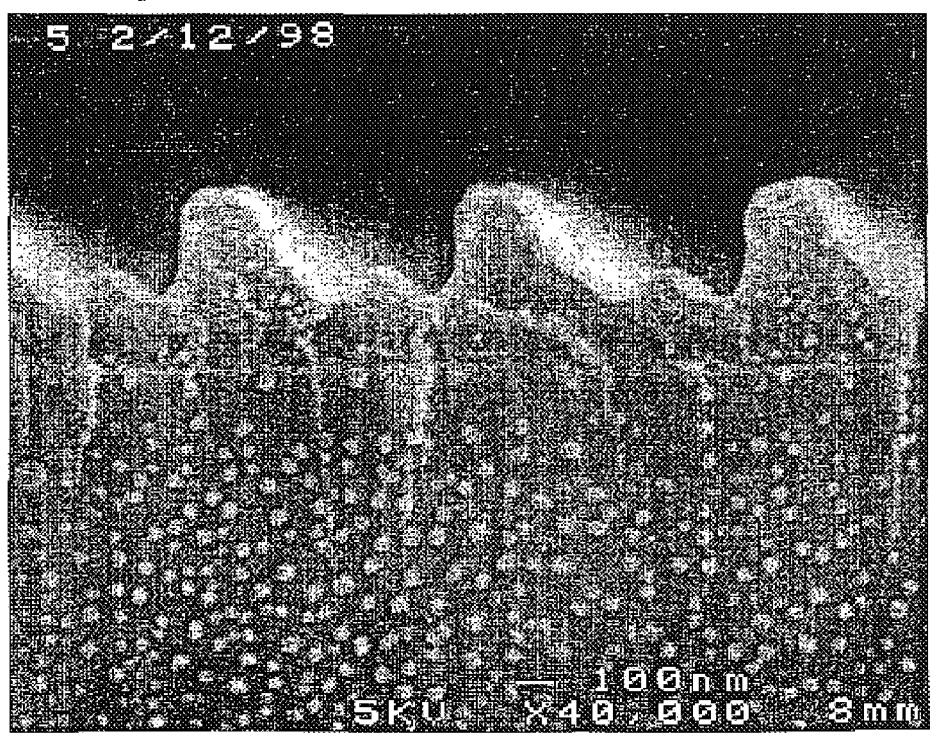
FIG. 3 is a cross-sectional SEM image of an asymmetric grating fabricated using the dual photoresist technique.

The technique described with reference to FIG. 1 above has been used to fabricate a blazed grating structure. The precise fabrication process used will now be described with reference to FIG. 3.

A glass substrate was cleaned and neat PMGI (poly (dimethyl-glutarimide) supplied by the Microlithography corporation) was deposited on it. The substrate was spun at 3000 rpm for 30 seconds. The solvent was removed by placing on a hotplate at 90° C. for 3 minutes. The substrate was then oven baked on a hotplate at 250° C. for 15 minutes which results in 1.1 µm thick film.

A layer of S1805 photoresist diluted 2:1 (resist to thinners) in thinner PGMEA was spun on to the substrate, providing a 303 nm layer of S1805 resist. The substrate was then prebaked at 100° C. for 10 minutes.

The substrate was exposed in interferometer, for 600 seconds, to radiation of wavelength $\lambda$=457.9 nm using a 300 mW expanded laser beam.

The substrate was developed in Shipley MF319 developer for 25 seconds to obtain a truncated profile in photoresist.

Figure 2:
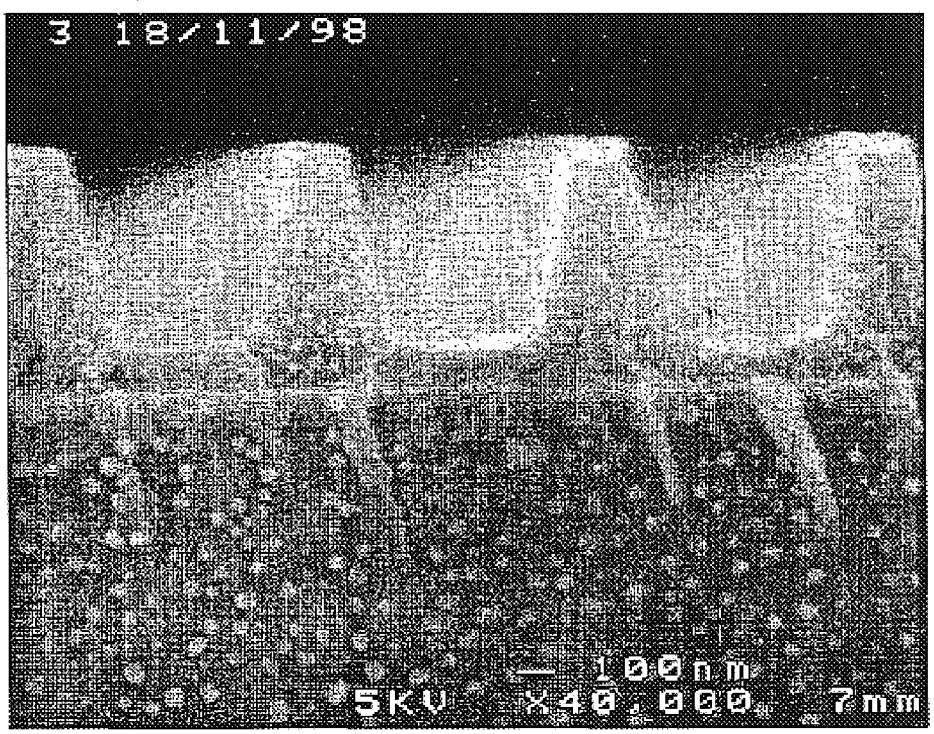
FIG. 2 is a cross-sectional SEM image of a deep groove symmetric grating fabricated using the dual photoresist technique.

The substrate Was then exposed, for 400 seconds, to light of $\lambda$=254 nm incident at an angle of 18° away from the substrate normal, The substrate was developed in MF319 for 10 seconds to obtain symmetric grating profile shown in FIG. 2.

The reason for using thinner resist for the 18° exposure was that self shadowing eventually becomes a problem for large exposure angles for example gratings exposed at 60° failed even under these conditions, nevertheless, because the photoresist acts as a conformal mask, we obtain a high degree of asymmetry even from a modest asymmetry exposure angle. A photoresist layer 303 nm thick preserved good contrast in the PMGI whilst being as thin as possible.

What is claimed is:

1. A process for making a blazed periodic profile in a photoresist layer comprising the steps of;

taking a first layer of photoresist material which will react to radiation of a first wavelength and which has deposited on it a second layer of photoresist material which will react to radiation of a second wavelength wherein the first photoresist material is substantially insoluble in a second solvent and wherein the layer of second photoresist material is substantially opaque to the radiation of the first wavelengh;

exposing the layer of second photoresist material to a pattern of radiation of the second wavelength;

treating the layer of second photoresist material with the second solvent so as to develop a first periodic profile;

exposing the layer of first photoresist material to radiation of the first wavelength through the first periodic profile;

treating the layer of first photoresist material with a first solvent so as to develop a second periodic profile, wherein the step of exposing the layer of first photoresist material to radiation of the first wavelength through the first periodic profile is performed with the radiation being directed toward the first layer at an angle away from the normal to the first photo-resist material.

2. A process for making a periodic profile in a photoresist layer as claimed in claim 1 and further comprising the initial step of depositing the layer of second photoresist material on the layer of first photoresist material.

3. A process for making a periodic profile in a photoresist layer as claimed in claim 2 and further comprising the initial step of depositing a layer of first photoresist material on a substrate.

4. A process for making a periodic profile in a photoresist layer as claimed in claim 1, wherein the layer of second photoresist material is a positive photoresist material.

5. A liquid crystal device comprising a photoresist layer having a blazed periodic profile,
   the blazed periodic profile being configured to impart alignment to liquid crystal molecules of the liquid crystal device,
   wherein the blazed periodic profile is formed using the process as claimed in any one of the preceding claims.

\* \* \* \* \*